(12) United States Patent (10) Patent No.: US 12,648,458 B2

Mori (45) Date of Patent: Jun. 2, 2026

(54) CROSSTALK NOISE REDUCTION BY HIGH PERMEABILITY INSULATOR

(71) Applicant: International Business Machines Corporation, Armonk, NY (US)

(72) Inventor: Hiroyuki Mori, Yasu (JP)

(73) Assignee: International Business Machines Corporation, Armonk, NY (US)

( * ) Notice: Subject to any disclaimer, the term of this patent is extended or adjusted under 35 U.S.C. 154(b) by 343 days.

(21) Appl. No.: 18/344,147

(22) Filed: Jun. 29, 2023

(65) Prior Publication Data

US 2025/0006647 A1 Jan. 2, 2025

(51) Int. Cl.

| | |
|---|---|
| *H10W 70/60* | (2026.01) |
| *H05K 3/46* | (2006.01) |
| *H10W 20/00* | (2026.01) |
| *H10W 70/69* | (2026.01) |
| *H10W 70/695* | (2026.01) |
| *H10W 90/00* | (2026.01) |

(52) U.S. Cl.

CPC ........ *H10W 70/611* (2026.01); *H05K 3/4673* (2013.01); *H10W 20/0526* (2026.01); *H10W 70/69* (2026.01); *H10W 70/695* (2026.01); *H10W 90/401* (2026.01); *H05K 2201/083* (2013.01); *H05K 2203/068* (2013.01)

(58) Field of Classification Search

USPC .......................................... 438/128

See application file for complete search history.

(56) References Cited

U.S. PATENT DOCUMENTS

| | | | |
|---|---|---|---|
| 4,707,671 A | 11/1987 | Suzuki et al. | |
| 6,903,444 B2 | 6/2005 | Forbes et al. | |
| 7,154,354 B2 | 12/2006 | Akram et al. | |
| 7,829,979 B2 | 11/2010 | Forbes et al. | |
| 2002/0150838 A1* | 10/2002 | Zhang ..................... | H01L 24/96 |
| | | | 430/394 |
| 2003/0173653 A1* | 9/2003 | Forbes ................ | H01L 23/5225 |
| | | | 257/E21.656 |
| 2004/0161930 A1* | 8/2004 | Ma ..................... | H01L 21/76802 |
| | | | 257/E21.252 |
| 2004/0233010 A1* | 11/2004 | Akram ................ | H01L 23/5225 |
| | | | 257/E23.114 |
| 2005/0130443 A1* | 6/2005 | Meth .................... | H10D 30/031 |
| | | | 438/455 |
| 2005/0130447 A1* | 6/2005 | Takaya .................... | H01P 7/082 |
| | | | 524/492 |
| 2006/0261448 A1* | 11/2006 | Forbes .................... | G11C 7/02 |
| | | | 257/662 |

(Continued)

OTHER PUBLICATIONS

Metamaterials to Reduce Cross-Talk in Coplanar Transmission Line (Jul. 16, 2013) https://ip.com/IPCOM000229247.

(Continued)

*Primary Examiner* — Chineyere Wills-Burns

(74) *Attorney, Agent, or Firm* — Harrity & Harrity, LLP

(57) ABSTRACT

An electrical device is provided that includes a wiring level including a plurality of metal lines, and an dielectric filling a space between adjacent metal lines in the plurality of metal lines of the wiring level. The dielectric comprises an epoxy composition having a filler of magnetic fillers. The dielectric has a permeability that reduces crosstalk noise between the adjacent metal lines in the plurality of metal lines of the wiring level.

20 Claims, 7 Drawing Sheets

(56)                    References Cited

U.S. PATENT DOCUMENTS

| | | | |
|---|---|---|---|
| 2007/0054485 A1* | 3/2007 | Torres | H01L 21/76831 |
| | | | 438/622 |
| 2008/0242112 A1* | 10/2008 | Wu | H10K 10/471 |
| | | | 257/E21.24 |
| 2011/0017501 A1* | 1/2011 | Ohmi | H01F 1/26 |
| | | | 428/323 |
| 2019/0206597 A1* | 7/2019 | Brown | H01F 1/20 |
| 2019/0318990 A1* | 10/2019 | Nakagawa | H01L 23/49827 |
| 2022/0153909 A1* | 5/2022 | Kono | C09D 125/08 |
| 2022/0263354 A1* | 8/2022 | Garcia Gallegos | C08L 83/04 |
| 2023/0215890 A1* | 7/2023 | Mun | H10F 39/8063 |
| | | | 257/292 |

OTHER PUBLICATIONS

Ma, J., Muroga, S., Endo, Y., Hashi, S., Naoe, M., Yokoyama, H., . . . & Ishiyama, K. (Dec. 18, 2017). Noise suppression and crosstalk analysis of on-chip magnetic film-type noise suppressor. AIP Advances, 8(5), 056613.

Yamaguchi, M., Kim, K. H., Kuribara, T., & Arai, K. I. (Sep. 1, 2002). Thin-film RF noise suppressor integrated in a transmission line. IEEE transactions on magnetics, 38(5), 3183-3185.

* cited by examiner

CROSSTALK NOISE REDUCTION BY HIGH PERMEABILITY INSULATOR

BACKGROUND

The present invention generally relates to electrical devices, and more particularly to insulation of the metal lines for carrying electrical current in microelectronic devices.

Semiconductor production techniques continually progress to deliver more aggressive scaling of semiconductor devices, and various elements which constitute semiconductor integrated circuits (ICs) are becoming smaller in size. As a result of this technological progress, integrated circuits are mounted on a semiconductor substrate with a greater density and with a greater functionality. This has also narrowed the distance between signal lines disposed on the substrates.

In electronics, crosstalk is any phenomenon by which a signal transmitted on one circuit or channel of a transmission system creates an undesired effect in another circuit or channel. Crosstalk is usually caused by undesired capacitive, inductive, or conductive coupling from one circuit or channel to another. Crosstalk tends to degrade system performance by introducing variable and unpredictable components to signals. Particularly in the case of dynamic semiconductor memory devices, the crosstalk between signal lines can effect the reliability of the product as the integrating density increases.

Existing techniques to reduce coupling between conductors include adding ground conductors between signal conductors or positioning the signal conductors farther away from one another. However, the addition of ground conductors between signal conductors increases the number of conductors, thereby increasing the cost and complexity of the system. Positioning the signal conductors farther away from one another increases the size of the device, which is opposite the goal of aggressive scaling.

SUMMARY

The methods and structures of the present disclosure reduce crosstalk by positioning a high permeability insulator between adjacent metal lines. More particularly, crosstalk between adjacent metal lines is reduced by positioning an epoxy based dielectric with magnetic fillers between adjacent metal lines. The epoxy based dielectric with magnetic filler that is described herein has a high permeability. For example, the permeability of the epoxy dielectric with metal filler is at least 200 times greater than the permeability of vacuum. By providing a high permeability insulator for substitution of typical dielectrics separating adjacent metal lines, the incidence of crosstalk noise may be minimized while maintaining aggressive scaling, and not introducing further complexity to the structure.

In one embodiment, an electrical device is provided that includes a wiring level including a plurality of metal lines, and an dielectric filling a space between adjacent metal lines in the plurality of metal lines of the wiring level. The dielectric comprises an epoxy composition having magnetic fillers. The dielectric has a permeability that reduces crosstalk noise between the adjacent metal lines in the plurality of metal lines of the wiring level.

In one example, the epoxy composition is a thermosetting composition.

In one example, the filler of magnetic fillers has a cobalt (Co), zirconium (Zr) and niobium (Nb) containing composition.

In one example, the permeability of the dielectric filling the space between metal lines is 200 times the permeability of vacuum.

In one example, the electrical device further includes a ground plane conductor below the wiring level, and a power supply conductor above the wiring level.

In one example, the metal lines are signal traces, ground traces or a combination thereof.

In another embodiment, an electrical device is provided that includes a wiring level including a plurality of metal lines, and an dielectric filling a space between adjacent metal lines in the plurality of metal lines of the wiring level. The dielectric comprises a thermosetting resin composition having a filler of magnetic fillers having a cobalt, zirconium and niobium containing composition. The dielectric has a permeability that reduces crosstalk noise between the adjacent metal lines in the plurality of metal lines of the wiring level.

In one example, the permeability of the dielectric filling the space between metal lines is 200 times the permeability of vacuum.

In one example, the electrical device further includes a ground plane conductor below the wiring level, and a power supply conductor above the wiring level.

In one example, the metal lines are signal traces, ground traces or a combination thereof.

In another aspect, a method is provided for forming the wiring level of an electrical device. In one embodiment, the method includes forming a plurality of metal lines for a wiring level. In one embodiment, the method further includes filling a space between adjacent metal lines in the plurality of metal lines of the wiring level with a dielectric material. The dielectric material may comprise an epoxy composition having a filler of magnetic fillers. The dielectric material may have a permeability that reduces crosstalk noise between the adjacent metal lines in the plurality of metal lines of the wiring level.

In one embodiment, the dielectric material may be deposited using a laminate technique. For example, a laminate layer may be applied into contact with the adjacent metal lines in the plurality of metal lines of the wiring level. The laminate layer may be deformed under elevated temperature and pressure to fill the space between the adjacent metal lines. In a following step, a planarization step is applied to remove the laminate layer from the upper surfaces of the adjacent metal lines.

In another embodiment, the dielectric material may be deposited from a liquid composition. For example, the liquid composition may be deposited using screen printing. Following deposition, the liquid composition may be dried and cured.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

The methods and structures of the present disclosure reduce crosstalk by positioning a high permeability insulator between adjacent metal lines. More particularly, crosstalk between adjacent metal lines is reduced by positioning an epoxy based dielectric with a filler of magnetic fillers between adjacent metal lines. The epoxy based dielectric with magnetic metal filler that is described herein has a high permeability. For example, the permeability of the epoxy dielectric with magnetic metal filler is at least 200 times greater than the permeability of vacuum. By providing a high permeability insulator for substitution of typical dielectrics separating adjacent metal lines, the incidence of crosstalk noise may be minimized while maintaining aggressive scaling, and not introducing further complexity to the structure.

The methods and structures for providing a crosstalk noise reduction with a high permeability insulator are now described with greater detail with reference to FIGS. 1-7.

Figure 1:
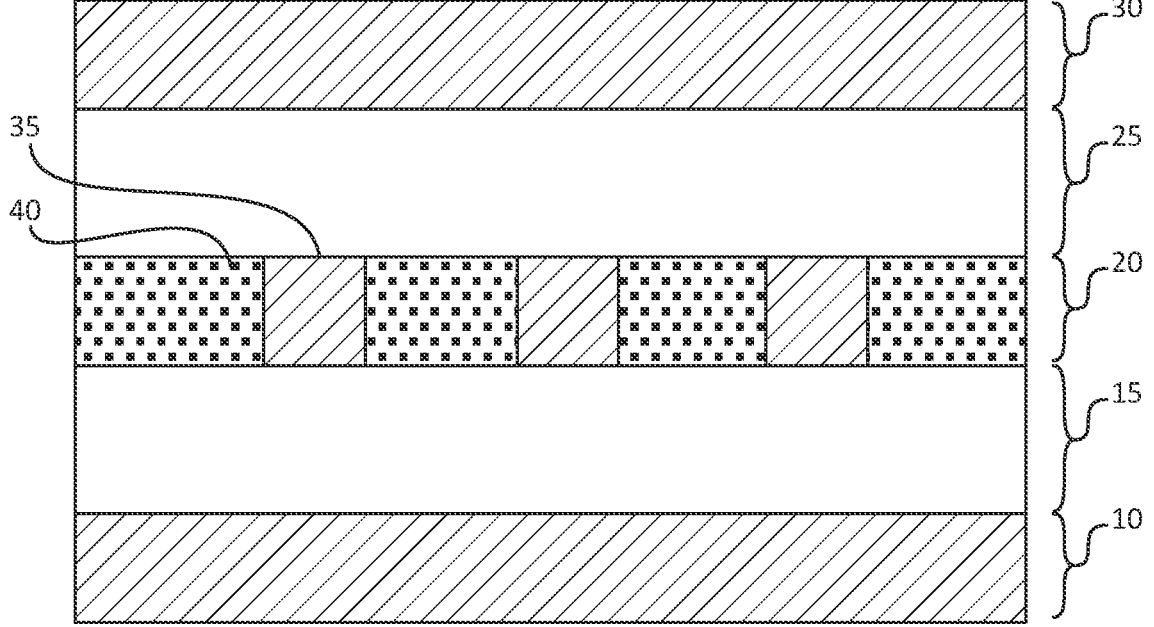
FIG. 1 is a side cross-sectional view illustrating an electrical device that includes a wiring level including a plurality of metal lines, and a dielectric material filling a space between adjacent metal lines that includes an epoxy composition having a filler of magnetic fillers, in accordance with one embodiment of the present disclosure.

FIG. 1 illustrates one embodiment of an electrical device that includes a wiring level 20 including a plurality of metal lines 35, and an interlevel dielectric 40 (also referred to as high permeability insulator or dielectric) filling a space between adjacent metal lines 35 in the plurality of metal lines of the wiring level 20. The interlevel dielectric 40 comprises an epoxy composition having a filler of magnetic fillers. The interlevel dielectric 40 has a permeability that reduces crosstalk noise between the adjacent metal lines 35 in the plurality of metal lines of the wiring level 20.

Magnetic Permeability is simply the ability of the material to form an internal magnetic field within itself under the influence of an applied magnetic field. Permeability is the ability of a material to become magnetized when exposed to a magnetic field. In some embodiments, the metal lines 35 may be referred to as transmission lines. The high permeability insulator, i.e., interlevel dielectric 40, may be between transmission lines 35. The permeability of the interlevel dielectric between the signal lines, i.e., metal lines 35 (also referred to as transmission lines) is higher than the permeability of dielectrics used in wiring levels of prior structures.

FIG. 1 shows one embodiment of signal interconnection that can be used in integrated circuits (ICs), such as complementary metal oxide semiconductor (CMOS) integrated circuits (ICs), where voltage signals are transmitted from one location to another. The first level of the structure identified by reference number 10 is a first conductor layer. The first conductor layer 10 may be composed of any electrically conductive material, such as copper, tungsten, titanium, silver, gold, aluminum, etc. The first conductor layer 10 that is depicted in FIG. 1 may also be referred to as a ground plane.

The layer atop the first conductor layer 10 is a first dielectric layer 15. The first dielectric layer 15 may be an interlevel dielectric. The first dielectric layer 15 may have a composition selected from the group consisting of silicon-containing materials, such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, $\alpha$-C:H).

Still referring to FIG. 1, the wiring level 20 is present atop the first dielectric layer 15, and it may include the transmission lines. The transmission lines may also be referred to as interconnection lines. The wiring level 20 may also include on or more ground lines. In some embodiments, the metal lines 35 present in the wiring level may be referred to as signal traces, ground traces or a combination thereof. The transmission lines, interconnection lines, and/or ground lines that are present in the wiring level can be collectively referred to as metal lines and identified by reference number 35. The conductor composition for the metal lines 35 may be composed of any electrically conductive material, such as copper, tungsten, titanium, silver, gold, aluminum, etc. Although not depicted in the supplied figures, each metal line may include a liner that is present between the conductive fill and the adjacent dielectric. The liner may be a diffusion barrier, an adhesion liner, a seed layer etc. In some embodiments, the liner may be a metal. In some embodiments, the liner may be a metal nitride, such as tantalum nitride, tungsten nitride, etc. The metal lines 35 illustrated in FIG. 1 may be separated by a tight pitch. The term "pitch" refers to the minimum center-to-center distance between metal lines. When referring to the minimum center to center distance, it is referring to the dimension that is supported by the manufacturing process that can reproduced the structure. Because the pitch is increasingly aggressive with increased scaling, crosstalk noise may also increase. However, with the methods, and structures of the present disclosure, a high permeability dielectric material identified by reference number 40 is present separating the adjacent metal lines 35 and minimizes crosstalk noise.

The high permeability dielectric material includes a resin component that may be an epoxy. Epoxy resins, also known as polyepoxides are a class of reactive prepolymers and polymers which contain epoxide groups. Epoxies are typically thermosetting. Epoxy resins may be reacted (cross-linked) either with themselves through catalytic homopolymerisation, or with a wide range of co-reactants including polyfunctional amines, acids (and acid anhydrides), phenols, alcohols and thiols. These co-reactants are often referred to as hardeners or curatives, and the cross-linking reaction is commonly referred to as curing. Epoxy compositions that are suitable for use with the present disclosure may include bisphenol A epoxy resin, bisphenol F epoxy resin, novolac epoxy resin, aliphatic epoxy resin, glycidylamine epoxy resin and combinations thereof.

Examples of the thermosetting resin include epoxy resin, phenol resin, amino resin, unsaturated polyester resin, polyurethane resin, silicone resin, urea resin, melamine resin, thermosetting polyimide resin, and diallyl phthalate resin. Preferably, epoxy resin and phenol resin, are used, and more preferably, epoxy resin and phenol resin are used in combination.

For the epoxy resin, for example, those which can be used, as an adhesive composition can be used, including bisphenol epoxy resin (particularly, bisphenol A epoxy resin, bisphenol F epoxy resin, bisphenol S epoxy resin, brominated bisphenol A epoxy resin, hydrogenated bisphenol A epoxy resin, bisphenol AF epoxy resin, etc.), phenol epoxy resin (particularly, phenol novolak epoxy resin, ortho-cresol novolak epoxy resin, etc.), biphenyl epoxy resin, naphthalene epoxy resin, fluorene epoxy resin, trishydroxyphenylmethane epoxy resin, and tetraphenylolethane epoxy resin. Furthermore, for example, hydantoin epoxy resin, trisglycidylisocyanurate epoxy resin, and glycidylamine epoxy resin can be also used. These can be used singly, or can be used in combination of two or more.

Of these examples of the epoxy resin, preferably, bisphenol epoxy resin, or more preferably, bisphenol A epoxy resin is used. Containing the epoxy resin allows for excellent reactivity with the phenol resin. The phenol resin is an epoxy resin curing agent, and for example, novolak phenol resins such as phenolnovolak resin, phenolaralkyl resin, cresol novolak resin, tert-butylphenolnovolak resin, and nonylphenolnovolak resin; resole phenol resin; and polyoxystyrenes such as polyparaoxystyrene are used. These can be used singly, or can be used in combination of two or more.

To provide high permeability properties, the thermosetting epoxy of the dielectric material 40 is filled with a filler of soft magnetic fillers. In one embodiment, the soft magnetic fillers have a composition of a cobalt (Co), zirconium (Zr) and niobium (Nb) alloy. It is noted that the cobalt (Co), zirconium (Zr) and niobium (Nb) alloy is only one example of a suitable composition of the soft magnetic fillers. Other examples of a soft magnetic material for the soft magnetic fillers include magnetic stainless steel (Fe—Cr—Al—Si alloy), Sendust (Fe—Si—Al alloy), Permalloy (Fe—Ni alloy), silicon copper (Fe—Cu—Si alloy), Fe—Si alloy, Fe—Si—B (—Cu—Nb) alloy, Fe—Si—Cr—Ni alloy, Fe—Si—Cr alloy, Fe—Si—Al—Ni—Cr alloy, and ferrite.

In some embodiments, the soft magnetic fillers are formed into flat (platy), that is, formed to have a small thickness and a wide plane. The soft magnetic particles have an aspect ratio of, for example, 8 or more, preferably 15 or more, and for example, 80 or less, preferably 65 or less.

The soft magnetic particles have an average particle size $D_{50}$ of, for example, 30 μm or more, preferably 50 μm or more, more preferably 60 μm or more, even more preferably 70 μm or more, and for example, 200 μm or less, preferably 100 μm or less, more preferably 80 μm or less.

The volume content of the soft magnetic particles in the epoxy for the dielectric 40 is, for example, 55% by volume or more. The permeability of the high permeability dielectric 40 is at least twenty times greater than the permeability of vacuum.

Referring to FIG. 1, a second dielectric layer 25 may be present atop the wiring level 20. The second dielectric layer 25 may be an interlevel dielectric. The second dielectric layer 25 may have a composition selected from the group consisting of silicon-containing materials, such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H).

The level of the structure identified by reference number 30 is a second conductor layer. The second conductor layer 30 may be composed of any electrically conductive material, such as copper, tungsten, titanium, silver, gold, aluminum, etc. The second conductor layer 30 that is depicted in FIG. 1 may also be referred to as a power supply or ground plane.

It is noted that the structure depicted in FIG. 1 illustrates only one embodiment of the present disclosure, and that variations to the structures depicted in the supplied figures and the above description are within the scope of the present disclosure.

Figure 2:
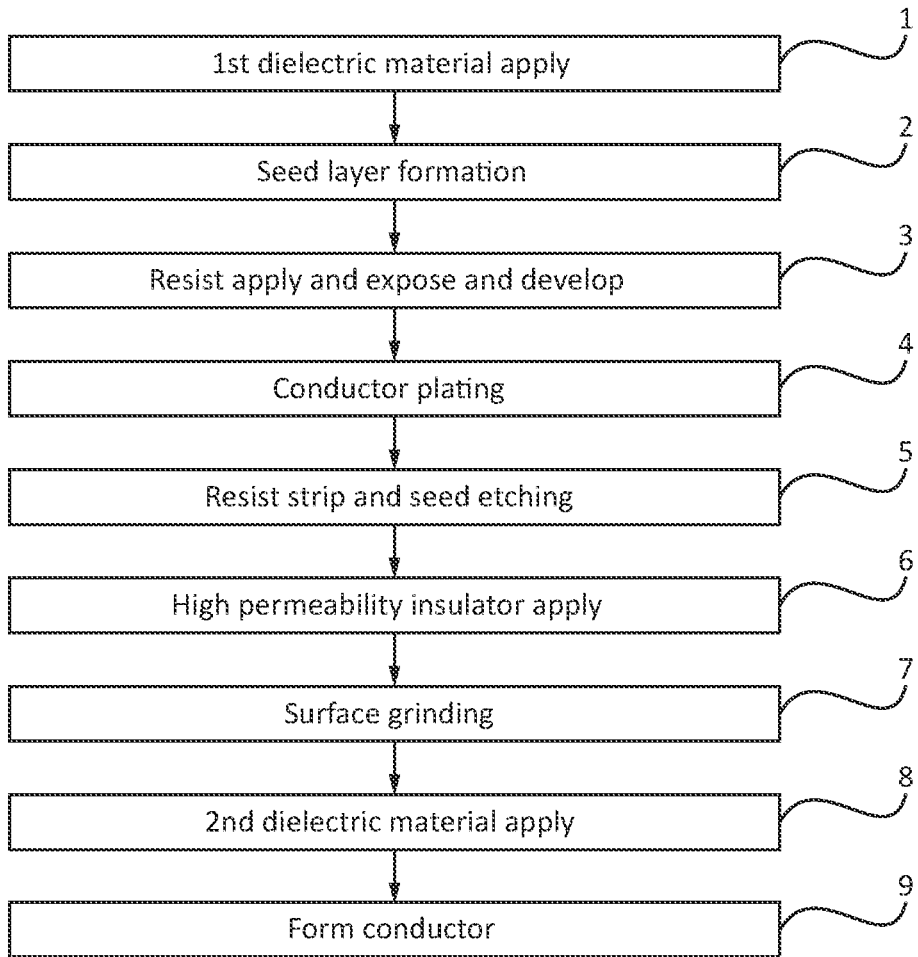
FIG. 2 is a block diagram/flow chart illustrating a method of reducing crosstalk noise between metal lines with a high permeability dielectric of an epoxy with a filler of magnetic metal fillers, in accordance with one embodiment of the present disclosure.

FIG. 2 is a block diagram/flow chart illustrating a method of reducing crosstalk noise between metal lines with a high permeability dielectric of an epoxy with a filler of magnetic metal fillers. Blocks 1-5 of the method depicted in FIG. 1 product an initial structure of metal lines 35 present atop a supporting substrate of the first interlevel dielectric layer 15 that is present on the first conductor layer 10 that provides the ground plane. The first conductor layer may be formed using a plating process, such as electroplating or electroless plating. In other embodiments, the first conductor layer 10 may be formed using a physical vapor deposition (PVD) process, such as sputtering. Referring to block 1 of FIG. 2, the first interlevel dielectric layer 15 may be formed using chemical vapor deposition (CVD) atop the first conductor layer 10.

Blocks 2-5 describe one embodiment of an additive method for forming the metal lines 35, The metal lines 35 may be formed using plating and/or physical vapor deposition. The deposition of the electrically conductive material for the metal lines may be aided with the deposition of a thin seed layer at block 2. The seed layer may be formed using a deposition process, such as plating, physical vapor deposition, atomic layer deposition, chemical vapor deposition or combinations thereof. At block 3, the structure may then be patterned. For example, block 3 may include depositing a photoresist layer, patterning the photoresist layer and then developing the patterned photoresist layer to provide a mask, in which the mask exposes sections of the seed layer on which the conductive material for the metal lines 35 may be formed. This is an additive method for forming the metal lines. More specifically, at block 4 the method may continue with depositing a conductor onto the exposed portions of the seed layer to form the metal lines 35. The conductor for the metal lines 35 may be deposited by a plating method, such as electroplating or electroless plating. The conductor material is not formed on the portions of the seed layer that are covered by the mask. Turning to block 5, in a following step, the mask of photoresist may then be removed. A chemical stripping process may be employed to remove the photoresist mask. Thereafter, the exposed portions of the seed layer that were exposed by removing the photoresist mask may then be removed by an etch that is selective to the metal lines 35 and the first interlevel dielectric layer 15.

The above provided description of blocks 1-5 represent one embodiment of forming the initial structure for producing the structure including the wiring level 20 that is depicted in FIG. 1. It is noted that this is only one process flow for forming the initial structure. The present disclosure is not limited to only example, which produces the metal lines employing an additive process flow. For example, a subtractive method may also be used to form the metal lines 35. The subtractive method may include a blanket deposition of conductor material on the seed layer formed in block 2. Following the formation of the blanket conductor layer, an etch mask may be formed on the conductor layer, e.g., a photoresist etch mask. A directional etch, such as reactive ion etching (RIE) may remove the exposed portions of the blanket conductor layer, wherein the remaining portions of the blanket conductor layer provide the metal lines 35.

Referring back to FIG. 2, the method may continue to block 6, which includes the applying the high permeability dielectric material 40 that fills the space separating the adjacent metal lines 35 in the wiring level 20. The dielectric material 40 may comprise an epoxy composition having a filler of magnetic fillers. The dielectric material 40 may have a permeability that reduces crosstalk noise between the adjacent metal lines 35 in the plurality of metal lines of the wiring level 20. The high permeability dielectric material 40 may be deposited using a laminate technique, as depicted in FIG. 3, or the high permeability dielectric material 40 may be deposited using a screen printing technique, as depicted in FIG. 4.

Figure 3:
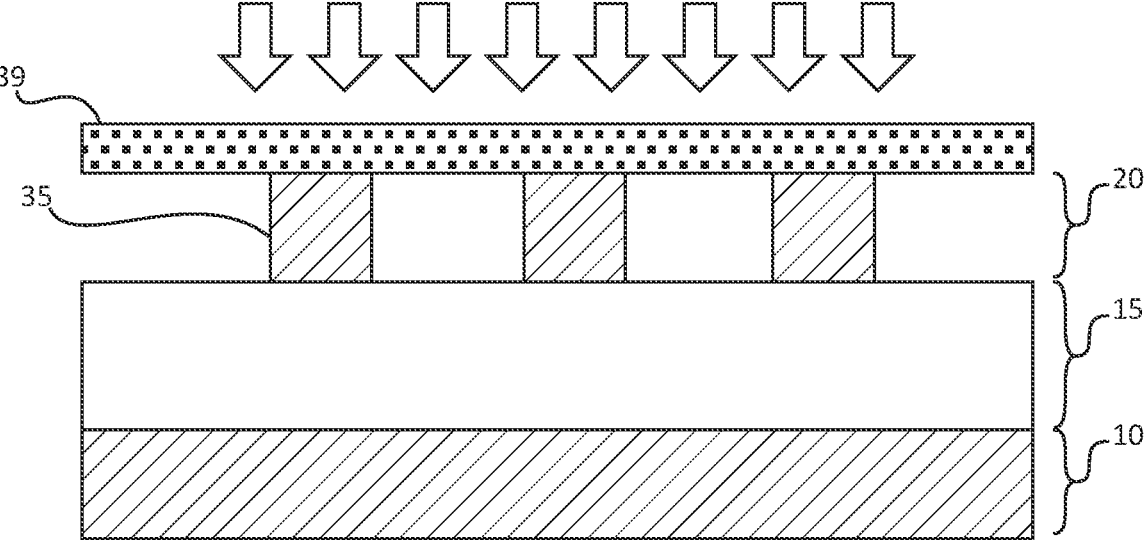
FIG. 3 is a side cross-sectional view illustrating one embodiment of forming the high permeability dielectric in the wiring level between the adjacent metal lines using a lamination technique.

FIG. 3 illustrates one embodiment of forming the high permeability dielectric 40 in the wiring level 20 between the adjacent metal lines 35 using a lamination technique. For example, a laminate layer 39, e.g., in the configuration of a flexible tape, may be applied into contact with the adjacent metal lines 35 in the plurality of metal lines of the wiring level. The laminate layer 39 may be deformed under elevated temperature and pressure to fill the space between the adjacent metal lines 35. The pressure is, for example, 10 MPa or more, preferably 20 MPa or more, and for example, 500 MPa or less, preferably 200 MPa or less. In this manner, the soft magnetic film highly filled with, the soft magnetic particles, and the thin soft magnetic film can be achieved mote excellently. The heating temperature is, for example, 80° C. or more, preferably 100° C. or more, and for example, 200° C. or less, preferably 175° C. or less. The application of elevated temperatures softens the laminate 39 so that it may be deformed, while the pressure applied to the heated laminate 39 deforms the laminate 39 to fill the space between metal lines 35. It is noted that a portion of the laminate 39 extends atop the upper surfaces of the metal lines 35. The portion of the laminate 39 that formed atop the upper surfaces of the metal lines 35 may be removed in a later planarization step.

Figure 4:
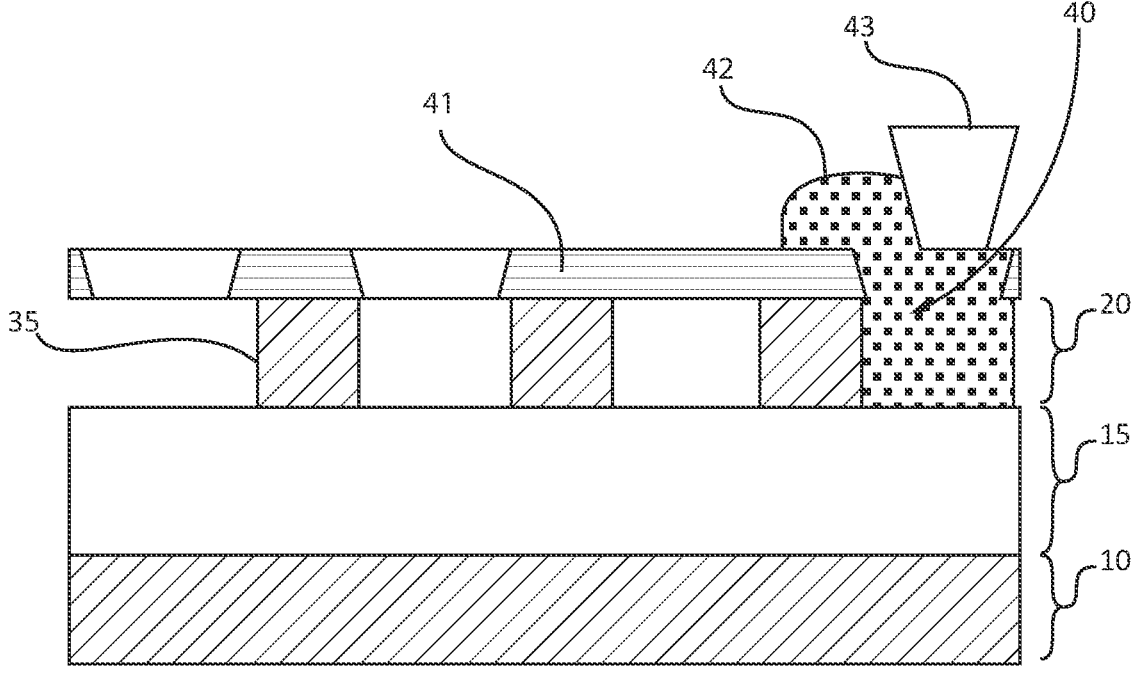
FIG. 4 is a side cross-sectional view illustrating one embodiment of forming the high permeability dielectric in the wiring level between the adjacent metal lines using a screen printing technique.

FIG. 4 illustrates one embodiment of forming the high permeable dielectric 40 in the wiring level 20 between the adjacent metal lines 35 using a screen printing technique.

The material for the high permeable dielectric 40 is applied in a liquid form 42 to a screen 41 having openings that provides a stencil for applying the liquid material to the spaces between the metal lines 35. The liquid high permeable dielectric 40 can be pressed through the screen 41 using a squeegee 43, as depicted in FIG. 4. Following application, the liquid material is allowed to dry, and is then cured above room temperature (e.g., 20° C. to 25° C.), to provide the high permeable dielectric 40 filling the space between the adjacent metal lines 35 in the wiring level 20.

Figure 5:
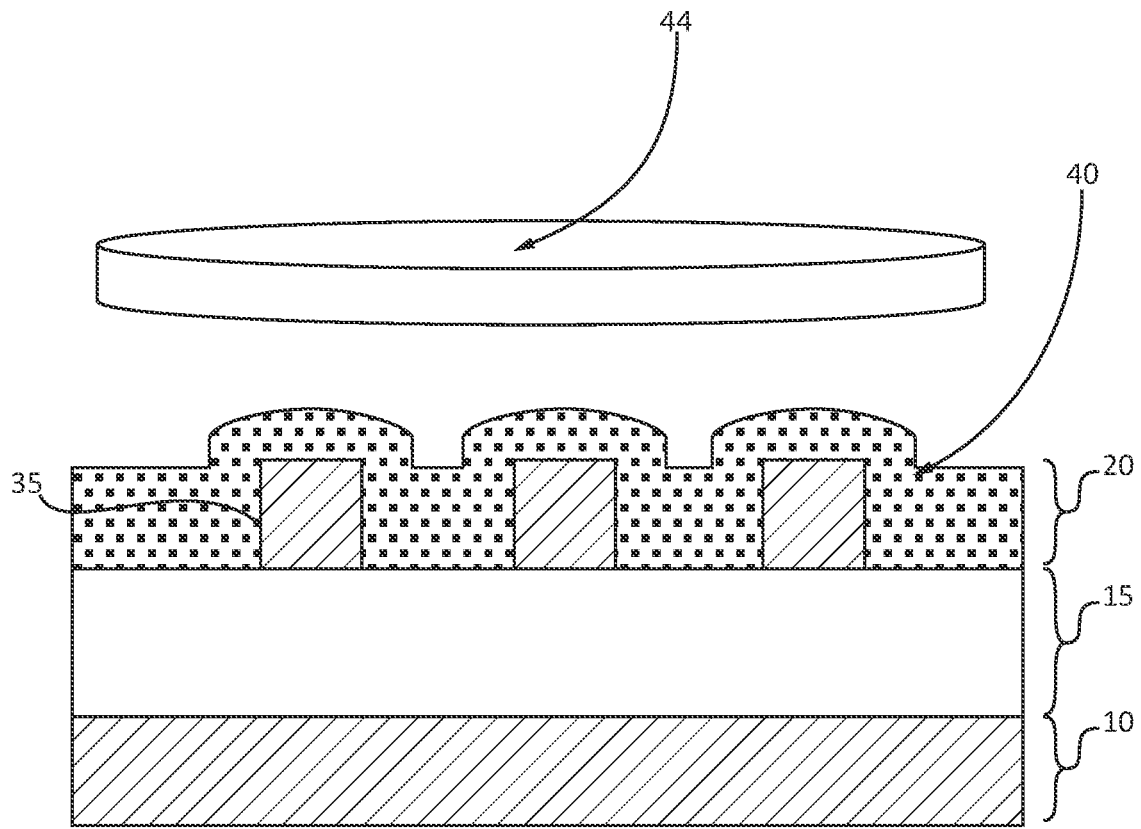
FIG. 5 is a side cross-sectional view illustrating a planarization technique applied to the high permeability dielectric following initial deposition as illustrated in FIGS. 3 and 4, in accordance with one embodiment of the present disclosure.

In a following step, a planarization step is applied to remove the laminate layer from the upper surfaces of the adjacent metal lines, or to remove the portion of any screen printed material that extends atop the upper surfaces of the adjacent metal lines at block 7 of FIG. 2. FIG. 5 depicts a planarization technique applied to the high permeability dielectric following initial deposition as illustrated in FIGS. 3 and 4. The planarization technique 44 may be accomplished using chemical mechanical planarization (CMP) and/or grinding. Following the planarization technique, the upper surfaces of the metal lines 35 and the high permeability dielectric 40 may be coplanar, which provides that the entire upper surface of the structure is planar.

Referring back to FIG. 2, the method can continue to block 8, which includes depositing a second interlevel dielectric layer 25 atop the planarized upper surfaces of the high permeability dielectric 40 and the metal lines 35. The second interlevel dielectric layer 25 may be formed using chemical vapor deposition (CVD).

Block 9 of FIG. 2 includes forming a second conductor layer 30 atop the second interlevel dielectric layer 25. The second conductor layer 30 may be formed using a plating process, such as electroplating or electroless plating. In other embodiments, the second conductor layer 30 may be formed using a physical vapor deposition (PVD) process, such as sputtering.

Figure 6:
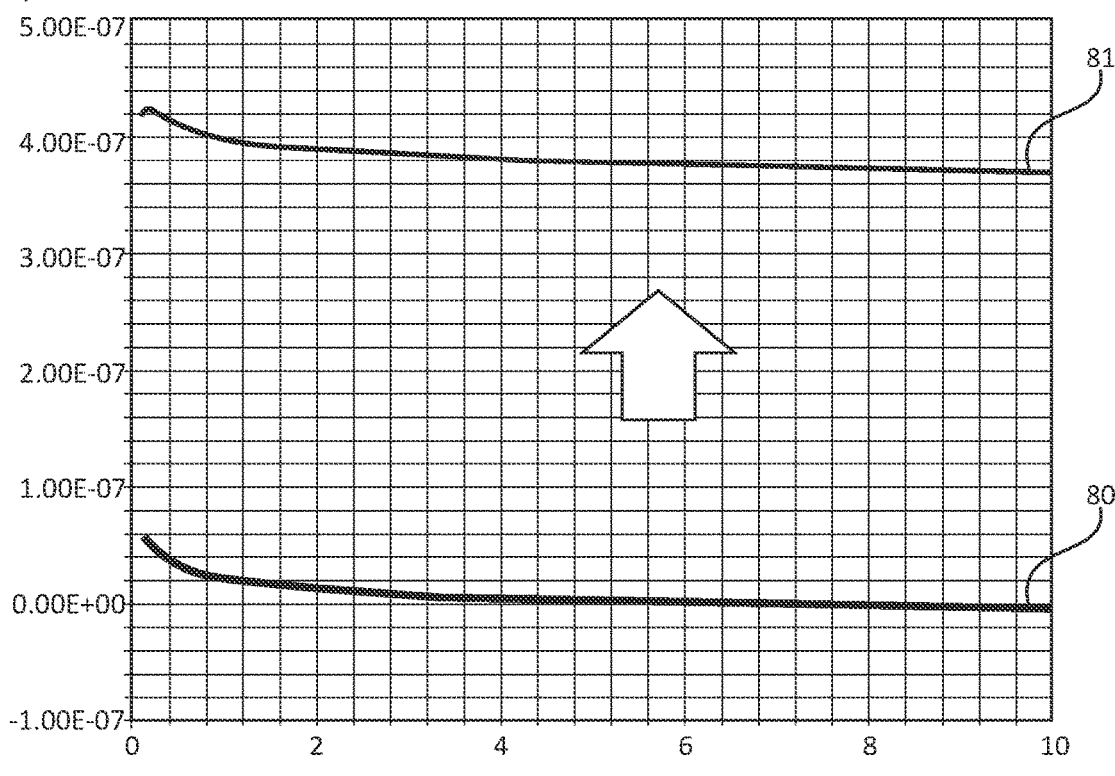
FIG. 6 is a plot illustrating crosstalk coefficient forward (kf) for the wiring level including the high permeability dielectric, in accordance with one embodiment of the present disclosure.

FIG. 6 is a plot identified by reference number 81 illustrating crosstalk coefficient forward (kf) for the wiring level 20 including the high permeability dielectric 40, as described with reference to FIGS. 1-5. The plot identified by reference number 80 illustrates crosstalk coefficient forward (kf) for a similar wiring level as the wiring level that provided plot 81 with the exception that the wiring level 20 that produced the data for plot 80 does not include a high permeability dielectric 40 between metal lines 35. The plot identified by reference number 80 is a comparative example. Comparison of plots 80 and 81 illustrates a negligible increase in the illustrating crosstalk coefficient forward (kf) for the wiring level 20 including the high permeability dielectric 40 providing plot 81 when compared with the comparative example providing plot 80.

Figure 7:
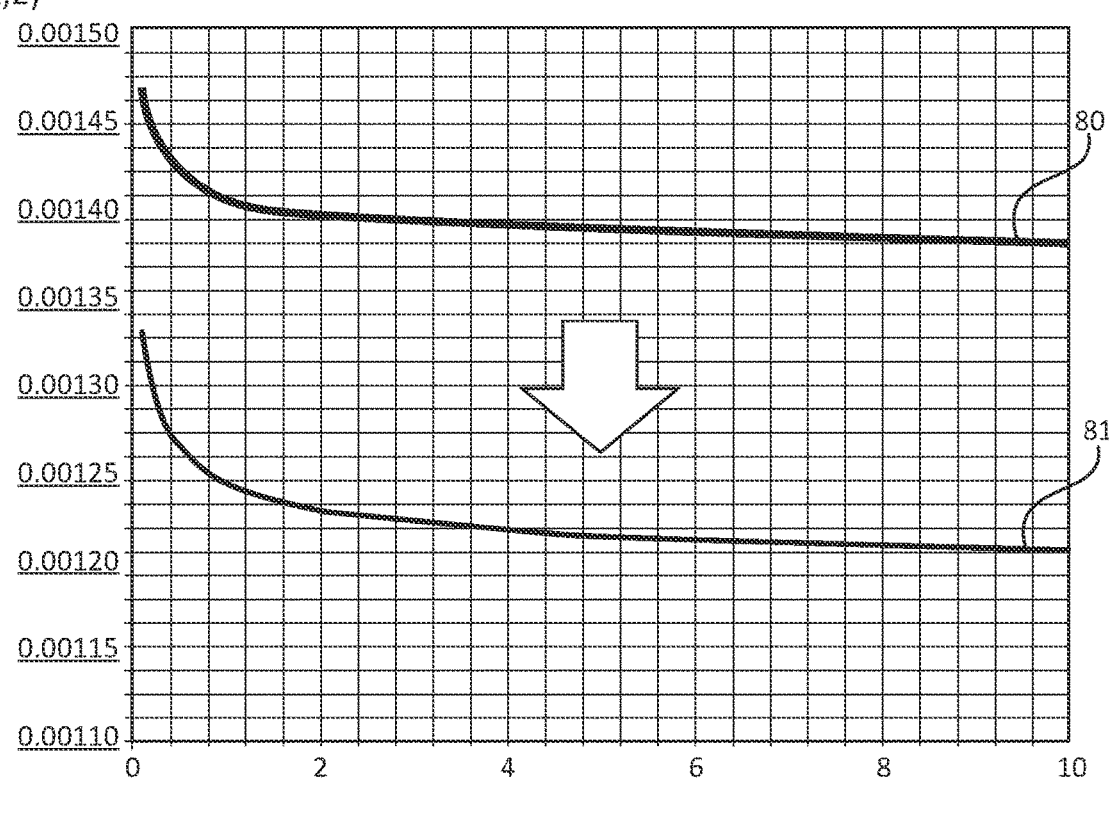
FIG. 7 is a plot illustrating crosstalk coefficient backward (kb) for the wiring level including the high permeability dielectric, in accordance with one embodiment of the present disclosure.

FIG. 7 is a plot illustrating crosstalk coefficient backward (kb) for the wiring level 20 including the high permeability dielectric 40, as described with reference to FIGS. 1-5. The plot identified by reference number 80 illustrates the crosstalk coefficient backward (kf) for a similar wiring level 20 as the wiring level that provided plot 81 with the exception that the wiring level 20 that produced the data for plot 80 does not include a high permeability dielectric 40 between metal lines 35. The plot identified by reference number 80 is a comparative example. Comparison of plots 80 and 81 illustrates a 10% to 15% decrease in the crosstalk coefficient backward (Kb) for the wiring level 20 including the high permeability dielectric 40 providing plot 81 when compared with the comparative example providing plot 80.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. An electrical device comprising:
a wiring level including a plurality of metal lines;
a first dielectric layer below the wiring level;
a second dielectric layer above the wiring level; and
a dielectric filling a space between adjacent metal lines in the plurality of metal lines of the wiring level, wherein the dielectric comprises an epoxy composition having magnetic fillers, and wherein a composition of the first dielectric layer and a composition of the second dielectric layer are different from the epoxy composition of the dielectric filling the space between the adjacent metal lines.

2. The electrical device of claim 1, wherein the dielectric filling the space between the adjacent metal lines has a permeability that reduces crosstalk noise between the adjacent metal lines in the plurality of metal lines of the wiring level.

3. The electrical device of claim 1, wherein the epoxy composition is a thermosetting composition.

4. The electrical device of claim 1, wherein the magnetic fillers have a cobalt (Co), zirconium (Zr) and niobium (Nb) containing composition.

5. The electrical device of claim 2, wherein the permeability of the dielectric filling the space between the adjacent metal lines is at least 200 times the permeability of vacuum.

6. The electrical device of claim 2, further comprising a ground plane conductor below the wiring level, and a power supply conductor above the wiring level.

7. The electrical device of claim 1, wherein the plurality of metal lines are signal traces, ground traces or a combination thereof.

8. An electrical device comprising:
a wiring level including a plurality of metal lines;
a first dielectric layer below the wiring level;
a second dielectric layer above the wiring level; and
a dielectric filling a space between adjacent metal lines in the plurality of metal lines of the wiring level, wherein the dielectric comprises a thermosetting resin composition having magnetic fillers that have a cobalt, zirconium and niobium containing composition, and wherein a composition of the first dielectric layer and a composition of the second dielectric layer are different from the thermosetting resin composition of the dielectric filling the space between the adjacent metal lines.

9. The electrical device of claim 8, wherein the dielectric filling the space between the adjacent metal lines has a permeability that reduces crosstalk noise between the adjacent metal lines in the plurality of metal lines of the wiring level.

10. The electrical device of claim 8, wherein the dielectric filling the space between the adjacent metal lines has a permeability that is at least 200 times the permeability of vacuum.

11. The electrical device of claim 8, further comprising a ground plane conductor below the wiring level, and a power supply conductor above the wiring level.

12. The electrical device of claim 8, wherein the plurality of metal lines are signal traces, ground traces or a combination thereof.

13. A method for forming a wiring level of an electrical device comprising:
forming a first dielectric layer;
forming a plurality of metal lines for the wiring level above the first dielectric layer,
filling a space between adjacent metal lines in the plurality of metal lines of the wiring level with a dielectric material, wherein the dielectric material comprises an epoxy composition having magnetic fillers; and
forming a second dielectric layer above the wiring level, wherein a composition of the first dielectric layer and a composition of the second dielectric layer are different from the epoxy composition of the dielectric filling the space between the adjacent metal lines.

14. The method of claim 13, wherein the dielectric material has a permeability that reduces crosstalk noise between the adjacent metal lines in the plurality of metal lines of the wiring level.

15. The method of claim 13, wherein the dielectric material is deposited using lamination.

16. The method of claim 15, wherein the lamination comprises applying a laminate layer into contact with the adjacent metal lines in the plurality of metal lines of the wiring level; and deforming the laminate layer under elevated temperature and pressure to fill the space between the adjacent metal lines.

17. The method of claim 16, further comprising applying a planarization step to remove the laminate layer from upper surfaces of the adjacent metal lines.

18. The method of claim 13, wherein the dielectric material is deposited from a liquid composition.

19. The method of claim 18, wherein the liquid composition is deposited using screen printing.

20. The method of claim 19, wherein following deposition, the liquid composition is dried and cured.

* * * * *